(12) United States Patent
Okuhira

(10) Patent No.: US 11,949,219 B2
(45) Date of Patent: Apr. 2, 2024

(54) ELECTRICAL JUNCTION BOX

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Yusuke Okuhira, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

(*) Notice: Subject to any disclaimer, the term of this patent is extended or adjusted under 35 U.S.C. 154(b) by 227 days.

(21) Appl. No.: 17/753,133

(22) PCT Filed: Aug. 11, 2020

(86) PCT No.: PCT/JP2020/030570
§ 371 (c)(1),
(2) Date: Feb. 21, 2022

(87) PCT Pub. No.: WO2021/039376
PCT Pub. Date: Mar. 4, 2021

(65) Prior Publication Data
US 2022/0278515 A1   Sep. 1, 2022

(30) Foreign Application Priority Data
Aug. 29, 2019 (JP) ................................. 2019-156771

(51) Int. Cl.
*H02G 3/16* (2006.01)
*H01L 23/367* (2006.01)
(Continued)

(52) U.S. Cl.
CPC ............. *H02G 3/16* (2013.01); *H01L 23/367* (2013.01); *H02G 3/14* (2013.01); *H05K 1/115* (2013.01); *H05K 7/2039* (2013.01)

(58) Field of Classification Search
None
See application file for complete search history.

(56) References Cited

U.S. PATENT DOCUMENTS

| 5,923,084 A | 7/1999 | Inoue et al. | |
| 6,097,089 A * | 8/2000 | Gaku | H01L 23/3128 257/E23.105 |
| 2002/0162678 A1 | 11/2002 | Takano | |

FOREIGN PATENT DOCUMENTS

| JP | H5-20365 | 3/1993 |
| JP | H8-204070 A | 8/1996 |

(Continued)

OTHER PUBLICATIONS

International Search Report, Application No. PCT/JP2020/030570, dated Nov. 10, 2020. ISA/Japan Patent Office.

*Primary Examiner* — Krystal Robinson
(74) *Attorney, Agent, or Firm* — Honigman LLP

(57) ABSTRACT

An object is to provide a technique that can make it easy to achieve favorable heat dissipation performance. An electrical junction box includes: a circuit substrate in which a via hole is formed; a blocking member that blocks the via hole; a heat-transfer member provided in a region of a main surface of the circuit substrate in which the via hole is formed; and a heat dissipation member that comes into contact with the heat-transfer member from the opposite side to the circuit substrate, wherein the blocking member is a solid member, and fills at least the main surface side of the via hole.

10 Claims, 2 Drawing Sheets

(51) Int. Cl.
*H02G 3/14* (2006.01)
*H05K 1/11* (2006.01)
*H05K 7/20* (2006.01)

(56) References Cited

FOREIGN PATENT DOCUMENTS

JP 2000-91884 A 3/2000
JP 2014-170834 A 9/2014

* cited by examiner

ELECTRICAL JUNCTION BOX

CROSS-REFERENCE TO RELATED APPLICATIONS

This application is the U.S. national stage of PCT/JP2020/030570 filed on Aug. 11, 2020, which claims priority of Japanese Patent Application No. JP 2019-156771 filed on Aug. 29, 2019, the contents of which are incorporated herein.

TECHNICAL FIELD

The present disclosure relates to an electrical junction box.

BACKGROUND

Japanese Unexamined Utility Model Application Publication No. 5-20365 discloses a technique for dissipating heat generated by an integrated circuit implemented on a printed substrate. Specifically, heat-conductive grease is applied between a surface pattern and the integrated circuit on the printed substrate. In addition, a conductor hole that is formed in a surface pattern portion is filled with the heat-conductive grease. Accordingly, heat generated by the integrated circuit is transmitted to a back side pattern via the heat-conductive grease, and is dissipated.

In the technique described in Japanese Unexamined Utility Model Application Publication No. 5-20365, there is a risk that the heat-conductive grease will leak from the conductor hole. In this case, there is a risk that, due to variation in how the heat-conductive grease spreads, the heat dissipation performance will vary.

In view of this, an object of the present disclosure is to provide a technique that can make it easy to achieve favorable heat dissipation performance.

SUMMARY

An electrical junction box according to the present disclosure includes: a circuit substrate in which a via hole is formed; a blocking member that blocks the via hole; a heat-transfer member provided in a region of a main surface of the circuit substrate in which the via hole is formed; and a heat dissipation member that comes into contact with the heat-transfer member from the opposite side to the circuit substrate, and the blocking member is a solid member, and fills at least the main surface side of the via hole.

ADVANTAGEOUS EFFECTS OF INVENTION

According to the present disclosure, favorable heat dissipation performance can be easily achieved.

DETAILED DESCRIPTION OF PREFERRED EMBODIMENTS

Figure 1:
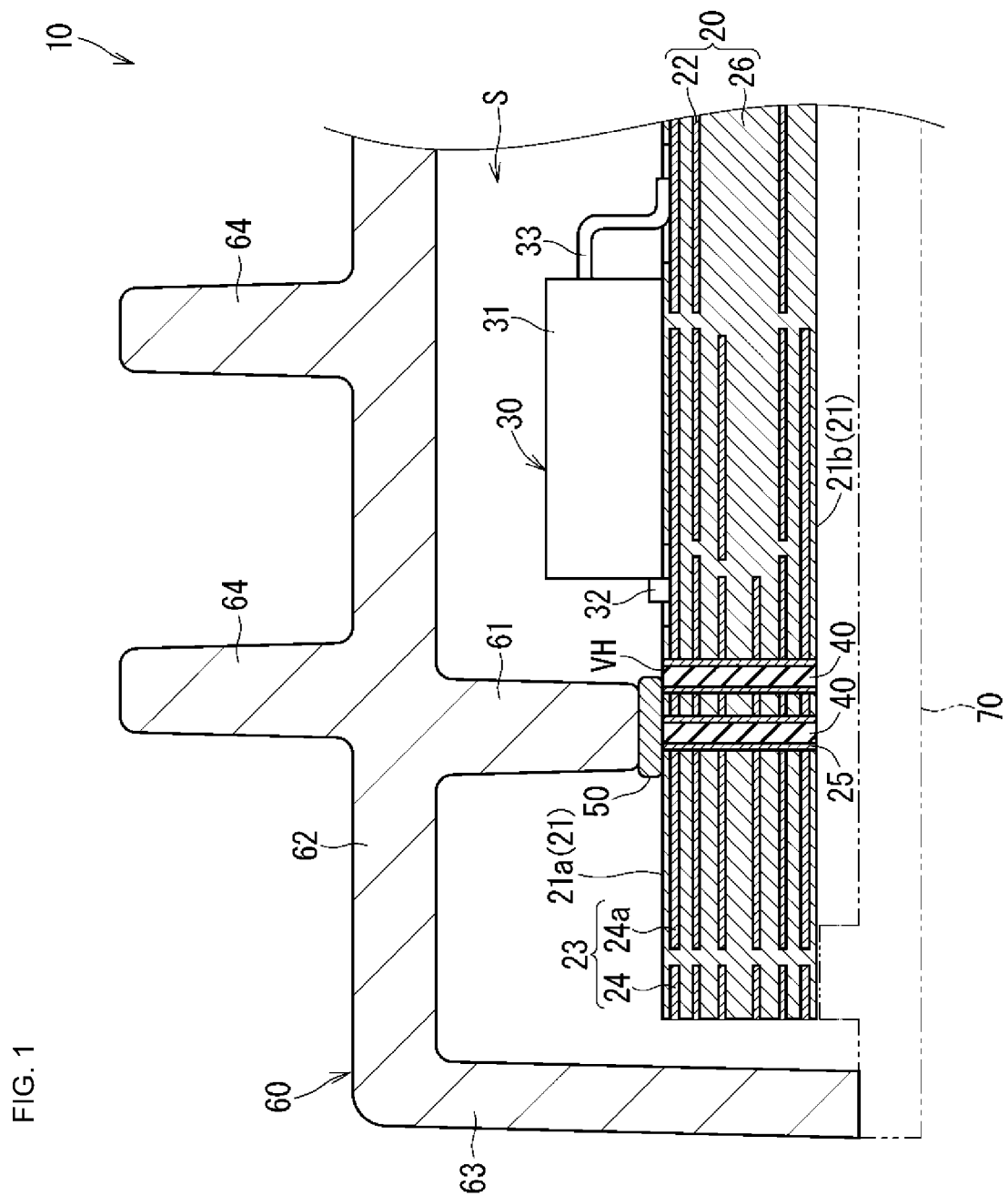
FIG. 1 is a cross-sectional view showing an electrical junction box according to an embodiment of the present disclosure.

First, embodiments of the present disclosure will be listed and described.

An electrical junction box according to the present disclosure is as follows.

An electrical junction box including: a circuit substrate in which a via hole is formed; a blocking member that blocks the via hole; a heat-transfer member provided in a region of a main surface of the circuit substrate in which the via hole is formed; and a heat dissipation member that comes into contact with the heat-transfer member from the opposite side to the circuit substrate, wherein the blocking member is a solid member, and fills at least the main surface side of the via hole. The blocking member keeps the heat-transfer member from entering the via hole. Accordingly, the heat-transfer member is likely to spread over a predetermined range on the main surface, and favorable heat dissipation performance is easily achieved.

The heat dissipation member may include a protruding wall that protrudes toward the main surface, and the protruding wall may be provided at a position so as to avoid a region of the main surface in which an electrical component is implemented and a leading end surface of the protruding wall may be in contact with the heat-transfer member. By providing the protruding wall on the main surface side on which the electrical component is implemented, the heat of the electrical components is likely to be efficiently transmitted to the heat dissipation member, and an increase in the temperature of the electrical component can be easily suppressed.

The heat dissipation member may further include a covering portion that covers the main surface, the protruding wall may protrude from an inner surface of the covering portion toward the main surface, and a space enclosed by the covering portion and the protruding wall may be formed to allow an electrical component implemented on the main surface to be housed. Accordingly, the heat dissipation member can also function as a container that houses the circuit substrate. In addition, the protruding wall is provided so as to protrude from the covering portion, and thus the via hole, the heat-transfer member, and the protruding wall can be easily disposed at positions close to the electrical component.

A field-effect transistor may be implemented on the circuit substrate, the circuit substrate may have a terminal connection conductor pattern that is connected to a terminal of the field-effect transistor, and the via hole may be provided so as to pass through the terminal connection conductor pattern. Accordingly, the heat dissipation of the conductor pattern that is connected to the field-effect transistor increases, thus making it easier to suppress an increase in the temperature of the field-effect transistor.

A major component of the blocking member may be a resin. Accordingly, parts in the electrical junction box are kept from short-circuiting via the blocking member.

A major component of the blocking member may be metal. Accordingly, the heat conductivity of the blocking member increases, and the heat dissipation can be improved.

Specific examples of an electrical junction box of the present disclosure will be described below with reference to the drawings. Note that the present invention is not limited to illustrations of these, but is indicated by the claims, and all changes that come within the meaning and range of equivalency of the claims are intended to be embraced therein.

Embodiments

Figure 2:
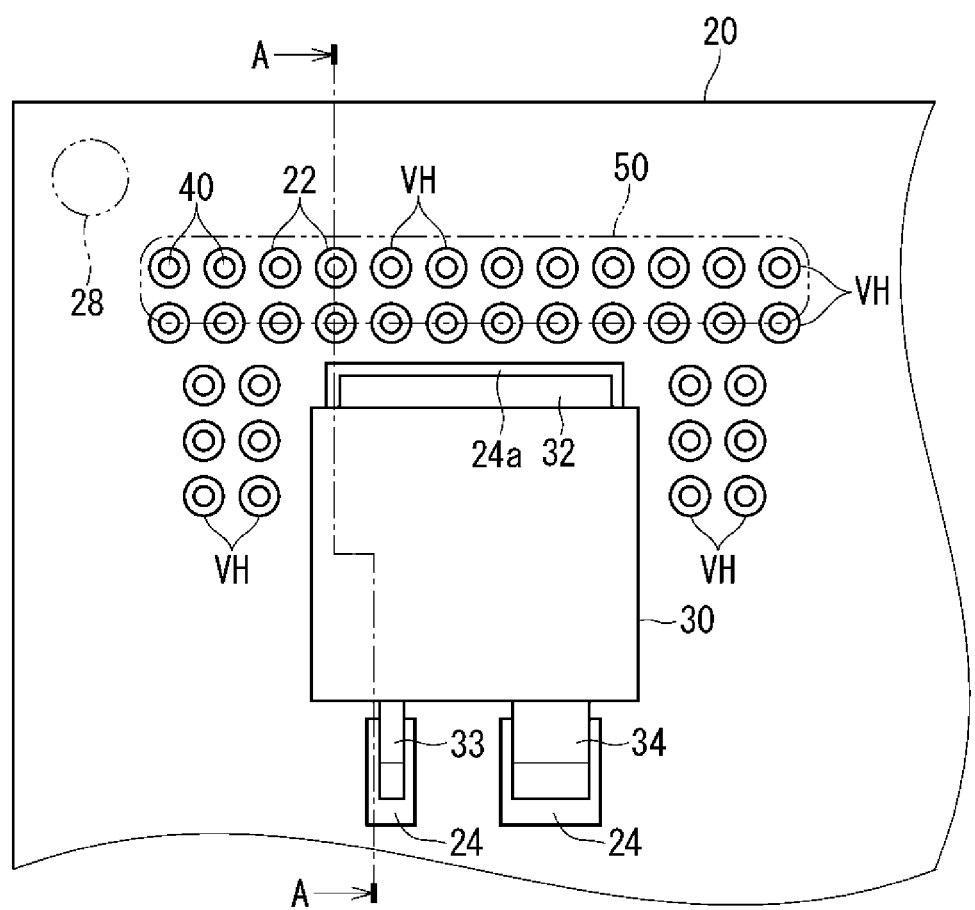
FIG. 2 is a plan view showing the electrical junction box with a heat dissipation member removed therefrom.

An electrical junction box according to an embodiment of the present disclosure will be described below. FIG. 1 is a cross-sectional view showing an electrical junction box 10 according to the embodiment. FIG. 2 is a plan view showing the electrical junction box 10 with a heat dissipation member 60 removed therefrom. Note that FIG. 1 corresponds to a cross-sectional view taken along line A-A in FIG. 2.

The electrical junction box 10 is disposed on a power supply path between a power source such as a battery and a load, that is, an in-vehicle electrical component such as a lamp or wipers, in a vehicle, for example. The electrical junction box 10 may be used for a large current semiconductor relay, a DC-DC converter or inverter, or the like. The electrical junction box 10 includes a circuit substrate 20, a blocking member 40, a heat-transfer member 50, and a heat dissipation member 60. The electrical junction box 10 also includes a cover member 70.

The circuit substrate 20 includes a conductive portion 22 and an insulative portion 26. The conductive portion 22 includes conductor layers 23 and an inner surface conductive portion 25. Here, the circuit substrate 20 is described as a multi-layer substrate that has three or more conductor layers 23. Note that, in the example shown in FIG. 1, six conductor layers 23 are provided, but the number of conductor layers 23 in the multi-layer substrate is not limited to this. The number of conductor layers 23 in the multi-layer substrate may be three, four, or five, or may be seven or more. Each of the six conductor layers 23 includes a conductor pattern 24. The conductor pattern 24 is formed such that conductive foil, conductive paste, or the like extends along a predetermined path on the conductor layer 23.

Via holes VH are formed in the circuit substrate 20. Each via hole VH is provided so as to pass through the conductor patterns 24 provided in the plurality of conductor layers 23. The inner surface conductive portion 25 is provided on the inner surface of the via hole VH. The inner surface conductive portion 25 electrically connects the conductor patterns 24 provided on the plurality of conductor layers 23. Accordingly, the inner surface conductive portion 25 is an interlayer connection portion. The inner surface conductive portion 25 is a plating material, conductive paste, solder, or the like. The same material as the material that forms the inner surface conductive portion 25 is provided on the opening peripheral edge of the via hole VH in a main surface 21, and a land may be formed.

In the example shown in FIG. 1, the via hole VH passes through the two main surfaces 21 of the circuit substrate 20. Such a via hole VH is also called a "through hole via", etc. A configuration may also be adopted in which the via hole reaches an intermediate portion in the thickness direction of the circuit substrate 20 from one surface thereof, namely a main surface 21*a*, and does not pass through the circuit substrate 20 to reach the other surface thereof, namely a main surface 21*b*. Such a via hole is called a "blind via hole", etc.

The insulative portion 26 includes an insulation layer and cover layers. The insulation layer is a portion positioned between conductor layers 23. The insulation layer is an insulative substrate main body such as a glass epoxy substrate. The cover layers are present on the main surfaces 21 of the circuit substrate 20. The cover layers are resists such as solder masks.

An electrical component 30 that is a heat-generating component is implemented on the circuit substrate 20. A description will be given below assuming that the electrical component 30 is implemented on the main surface 21*a*. In addition, the electrical component 30 is described below as a field-effect transistor (FET) 30. The FET 30 includes a main body 31 and terminals 32, 33, and 34. The terminals 32, 33, and 34 of the FET 30 are electrically connected to conductor patterns 24 on an outer layer. The conductor patterns 24 and the terminals 32, 33, and 34 may be may be connected to each other through soldering or the like. The three terminals 32, 33, and 34 of the FET 30 are electrically connected to different conductor patterns 24 on the outer layer. The three terminals 32, 33, and 34 of the FET 30 are a drain terminal 32, a gate terminal 33, and the source terminal 34, respectively. The via hole VH is provided so as to pass through a terminal-connection conductor pattern 24*a* that is connected to the drain terminal 32, from among the conductor patterns 24.

The blocking member 40 is a solid member. The blocking member 40 blocks the via hole VH. The blocking member 40 fills the via hole VH along the axial direction of the via hole VH over the entire length thereof. The blocking member 40 may fill only a portion of the via hole VH along the axial direction of the via hole VH. The blocking member 40 may fill at least a main surface 21 side of the via hole VH.

Here, a description will be given assuming that a major component of the blocking member 40 is a resin. The blocking member 40 may or may not be directly joined to the inner surface of the via hole VH (here, the inner surface conductive portion 25). If, for example, the material of the blocking member 40 can easily attach to the material of the inner surface of the via hole VH (here, the material of the inner surface conductive portion 25), the blocking member 40 can easily be directly joined to the inner surface of the via hole VH. In addition, for example, when the blocking member 40 that has fluidity fills the via hole VH and is then solidified and formed, the blocking member 40 is likely to be directly joined to the inner surface of the via hole VH.

If there are a plurality of via holes VH, the blocking member 40 may be provided in all of the via holes VH, or the blocking member 40 may be provided only in some of the via holes VH. When there is a via hole VH that is in contact with the heat-transfer member 50 and a via hole VH that is not in contact with the heat-transfer member 50, for example, the blocking member 40 may be provided only in the via hole VH that is in contact with the heat-transfer member 50 or the blocking member 40 may be provided in both the via hole VH that is in contact with the heat-transfer member 50 and the via hole VH that is not in contact with the heat-transfer member 50. If the blocking member 40 is provided in all via holes VH, a process of providing blocking members 40 is kept from being complicated. Specifically, there is no need to select a via hole VH in which the blocking member 40 is to be provided, and it is unlikely that providing of the blocking member 40 will be forgotten. If the blocking member 40 is provided only in a portion of the via holes VH, it is possible to decrease the weight of the electrical junction box 10. If the blocking member 40 is provided in only a portion of the via holes VH, a via hole VH filled with the blocking member 40 may be referred to as a first via hole, and a via hole VH that is not filled with the blocking member 40 may be referred to as a second via hole.

The outer surface of the blocking member 40 is in contact with the heat-transfer member 50. Note that the outer surface of the blocking member 40 may be flush with the main surfaces 21 of the circuit substrate 20. The outer surface of the blocking member 40 may protrude outward from a main surface 21 of the circuit substrate 20. The outer surface of the blocking member 40 may be recessed from a main surface 21 of the circuit substrate 20 to the inside of the via hole VH. As described above, it is conceivable that the blocking member 40 is obtained by filling the via hole VH with a material that has fluidity and solidifying the material. In this case, even if the via hole VH is filled with the material that has fluidity to be flush with the main surfaces 21 of the circuit substrate 20, the outer surface of the blocking member 40 may not be flush with the main surfaces 21 of the circuit substrate 20 or may not be flat, depending on the behavior of the material with fluidity during solidification.

The heat-transfer member 50 is provided in a region of a main surface 21 of the circuit substrate 20 in which the via hole VH is formed. Here, the heat-transfer member 50 is provided on the main surface 21a on which the electrical component 30 is implemented. The heat-transfer member may also be provided on the main surface 21b. The heat-transfer member 50 allows heat generated by the circuit substrate 20 to be easily transmitted to the heat dissipation member 60. The heat-transfer member 50 is called a "thermal Interface material (TIM)", etc. The heat-transfer member 50 is closely attached to the circuit substrate 20 and the heat dissipation member 60, and fills the gap between the circuit substrate 20 and the heat dissipation member 60. Accordingly, it is possible to reduce air included between the circuit substrate 20 and the heat dissipation member 60, and the thermal resistance of this portion is reduced.

The heat-transfer member 50 can be closely attached to the circuit substrate 20 and the heat dissipation member 60, for example, by the heat-transfer member 50, which has fluidity, as a result of being pressed against the circuit substrate 20 and the heat dissipation member 60. Preferably, the heat-transfer member 50 is a member that can be viscous at a lower temperature than the melting points of parts of the circuit substrate 20. The heat-transfer member 50 may also be a member that is viscous in a normal state, such as heat-transfer grease, in other words a semisolid member (viscous member), for example. Also, the heat-transfer member 50 may be a member that can be viscous before being solidified, such as an adhesive, for example.

The heat dissipation member 60 comes into contact with the heat-transfer member 50 from the opposite side to the circuit substrate 20. The heat dissipation member 60 is a member that receives heat generated by the circuit substrate 20, and dissipates the heat. The heat dissipation member 60 may be a member that functions as a heatsink. The heat dissipation member 60 is formed of a material that has high heat conductivity, for example, metal such as an aluminum alloy. The heat dissipation member 60 also serves as at least a portion of a case that houses the circuit substrate 20. The heat dissipation member 60 includes a protruding wall 61 and a covering portion 62. The heat dissipation member 60 also includes a peripheral wall 63 and fins 64. The heat dissipation member 60 is formed in a box shape that can house the circuit substrate 20.

The protruding wall 61 protrudes toward the main surface 21a of the circuit substrate 20. The protruding wall 61 is provided at a position so as to avoid a region of the main surface 21a in which the electrical component 30 is implemented. The leading end surface of the protruding wall 61 is in contact with the heat-transfer member 50.

The covering portion 62 covers the main surface 21a of the circuit substrate 20. The covering portion 62 is formed in a flat plate shape. The protruding wall 61 is provided so as to protrude from the inner surface of the covering portion 62 toward the main surface 21a. A space S enclosed by the protruding wall 61 and the covering portion 62 is formed to allow the electrical component 30 implemented on the main surface 21a to be housed.

The peripheral wall 63 is provided so as to protrude on the side on which the protruding wall 61 protrudes toward the covering portion 62. The peripheral wall 63 encloses the circuit substrate 20. The peripheral wall 63 is provided outside the outer edge of the circuit substrate 20. The protruding wall 61 is provided on the inner side relative to the peripheral wall 63. The peripheral wall 63 and the protruding wall 61 are provided spaced apart from each other.

The fins 64 are provided on the opposite side to the protruding wall 61 protruding from the covering portion 62, in other words, on the outer surface side of the covering portion 62. The fins 64 increase the surface area of the outer surface of the heat dissipation member 60. A plurality of fins 64 may be provided. A portion of the plurality of fins 64 may be provided on the back side of a portion of the covering portion 62 in which the protruding wall 61 protrudes.

The cover member 70 covers the circuit substrate 20 from the opposite side to the heat dissipation member 60. The circuit substrate 20 is housed on the inner sides of the cover member 70 and the heat dissipation member 60. The cover member 70 is attached to the heat dissipation member 60. The heat dissipation member 60 and the cover member 70 may be fixed to each other by a screw or the like. Here, the cover member 70 is formed in a plate shape. The material of the cover member 70 is not particularly limited, and may be a resin or metal, for example. Note that the peripheral wall 63 may be provided on the cover member 70 instead of being provided on the heat dissipation member 60. Accordingly, the cover member 70 may be formed in a box shape. A screw hole 28 may be formed in the circuit substrate 20. The circuit substrate 20 may be fixed to the heat dissipation member 60 or the cover member 70 by a screw or the like.

Exemplary Operation

A behavior example of the heat-transfer member 50 at the time of manufacturing the electrical junction box 10 will be described. A gap between the main surface 21a and the leading end surface of the protruding wall 61 when the heat dissipation member 60 is attached is defined as the length D1. The thickness of the heat-transfer member 50 before the heat dissipation member 60 is attached is defined as the length D2. The length D2 is set larger than the length D1. Therefore, when the heat dissipation member 60 is attached to the circuit substrate 20 and is positioned at a predetermined position, the heat-transfer member 50 is pressed by the leading end surface of the protruding wall 61 and the main surface 21a. At this time, the via hole VH is blocked by the blocking member 40, and thus the heat-transfer member 50 is kept from entering the via hole VH. Accordingly, the heat-transfer member 50 is likely to spread over a predetermined range of the main surface 21a. As a matter of course, the heat-transfer member 50 does not need to spread as a result of being pressed by the leading end surface of the protruding wall 61 and the main surface 21a.

Note that the lengths D1 and D2 are not particularly limited, and can be set as appropriate. The length D1 may be set to any value of 0.5 to 1 millimeter, for example. The length D2 may be set larger than the length D1 by any value of 0.1 to 1 millimeter, for example.

Effects, etc.

With the electrical junction box 10 configured as described above, the blocking member 40 keeps the heat-transfer member 50 from entering the via hole VH. Accordingly, the heat-transfer member 50 is likely to spread over a predetermined range of the main surface 21a, and favorable heat dissipation performance is easily achieved.

In addition, by providing the protruding wall 61 on the main surface 21a side on which the electrical component 30 is implemented, the terminal-connection conductor pattern 24a can come in contact with the protruding wall 61 via the heat-transfer member 50. Accordingly, the heat of the electrical component 30 is likely to be efficiently transmitted to the heat dissipation member 60, and an increase in the temperature of the electrical component 30 can be easily suppressed.

In addition, the heat dissipation member 60 includes the covering portion 62, and thus can also function as a container that houses the circuit substrate 20. In addition, the protruding wall 61 is provided so as to protrude from the covering portion 62, and thus the via hole VH, the heat-transfer member 50, and the protruding wall 61 can be easily disposed at positions close to the electrical component 30.

In addition, the via hole VH is provided so as to pass through the terminal-connection conductor pattern 24a, and thus the heat dissipation of the conductor pattern 24 that is connected to the field-effect transistor 30 increases, and an increase in the temperature of the field-effect transistor 30 can be easily suppressed.

In addition, a major component of the blocking member 40 is a resin, and thus parts in the electrical junction box 10 are kept from short-circuiting via the blocking member 40.

MODIFIED EXAMPLES

In the embodiment, a description has been given assuming that the circuit substrate 20 is a multi-layer substrate, but this is not an essential configuration. The circuit substrate may be a single-sided substrate that has one conductor layer 23, or may also be a double-sided substrate that has two conductor layers 23.

Also, in the embodiment, a description has been given assuming that the electrical component 30 is the FET 30, but this is not an essential configuration. The electrical component may be a heat-generating component other than the FET 30. Such a heat-generating component may be a resistor such as a shunt resistor, a coil, a capacitor, or the like. In the example shown in FIG. 1, one electrical component 30 is provided, but a plurality of electrical components 30 may be provided.

Also, in the embodiment, a description has been given assuming that, in the circuit substrate 20, the main surface 21a that is in contact with the heat dissipation member 60 via the heat-transfer member 50 is the same main surface 21a on which the electrical component 30 is implemented, but this is not an essential configuration. In a circuit substrate, the main surface that comes into contact with the heat dissipation member via the heat-transfer member may also be a main surface on the opposite side to the main surface on which an electrical component is implemented. In this case, the covering portion in the heat dissipation member may be in contact with the main surface of the circuit substrate via the heat-transfer member. Also, the two main surfaces of the circuit substrate may be in contact with the heat dissipation member via the heat-transfer member. Similarly, electrical components may be implemented respectively on the two main surfaces of the circuit substrate.

Also, in the embodiment, a description has been given assuming that a major component of the blocking member 40 is a resin, but this is not an essential configuration. A major component of the blocking member may be a material other than a resin such as metal, for example. The blocking member may be formed through reflow soldering, for example. If a major component of the blocking member is metal, the heat conductivity of the blocking member increases, and the heat dissipation is increased. In addition, for example, if a major component of the blocking member 40 is a resin, a metal layer may be laid on the outer surface of the blocking member 40. In this case, the heat-transfer member 50 is favorably provided on the metal layer.

Also, in the embodiment, a description has been given assuming that the heat-transfer member 50 is heat-transfer grease, but this is not an essential configuration. The heat-transfer member may be a member made of a material other than heat-transfer grease such as a heat-transfer sheet, for example.

Note that the configurations described in the above embodiment and the modified examples can be combined as appropriate provided that no contradiction arises.

The invention claimed is:

1. An electrical junction box comprising:
   a circuit substrate in which a via hole is formed;
   a blocking member that blocks the via hole;
   a heat-transfer member provided in a region of a main surface of the circuit substrate in which the via hole is formed; and
   a heat dissipation member that comes into contact with the heat-transfer member from the opposite side to the circuit substrate,
   wherein the circuit substrate has a terminal connection conductor pattern that is connected to a terminal of an electrical component that is implemented on the main surface,
   the terminal connection conductor pattern has a portion that spreads lateral to the electrical component,
   the via hole is provided so as to pass through the portion of the terminal connection conductor pattern that spreads lateral to the electrical component,
   the blocking member is a solid member, and fills at least the main surface side of the via hole,
   the heat-transfer member is a viscous body or a viscous adhesive that has been solidified,
   the heat dissipation member includes a protruding wall that protrudes toward the main surface, and
   the protruding wall is provided so as to protrude from the main surface toward the portion of the terminal connection conductor pattern that spreads lateral to the electrical component and a leading end surface of the protruding wall is in contact with the heat-transfer member.

2. The electrical junction box according to claim 1,
   wherein the heat dissipation member further includes a covering portion that covers the main surface,
   the protruding wall protrudes from an inner surface of the covering portion toward the main surface, and
   a space enclosed by the covering portion and the protruding wall is formed to allow an electrical component implemented on the main surface to be housed.

3. The electrical junction box according to claim 2, wherein a field-effect transistor is implemented on the circuit substrate, and
   a terminal of the field-effect transistor is connected to the terminal connection conductor pattern of the circuit substrate.

4. The electrical junction box according to claim 2, wherein a major component of the blocking member is a resin.

5. The electrical junction box according to claim 2, wherein a major component of the blocking member is metal.

6. The electrical junction box according to claim 1, wherein a field-effect transistor is implemented on the circuit substrate, and
   a terminal of the field-effect transistor is connected to the terminal connection conductor pattern of the circuit substrate.

7. The electrical junction box according to claim 6, wherein a major component of the blocking member is a resin.

8. The electrical junction box according to claim 6, wherein a major component of the blocking member is metal.

9. The electrical junction box according to claim 2, wherein a major component of the blocking member is a resin.

10. The electrical junction box according to claim 1, wherein a major component of the blocking member is metal.

\* \* \* \* \*